(12) United States Patent
Fogg

(10) Patent No.: US 6,836,095 B2
(45) Date of Patent: Dec. 28, 2004

(54) BATTERY CHARGING METHOD AND APPARATUS

(75) Inventor: John Kenneth Fogg, Cary, NC (US)

(73) Assignee: Semtech Corporation, Morrisville, NC (US)

( * ) Notice: Subject to any disclaimer, the term of this patent is extended or adjusted under 35 U.S.C. 154(b) by 72 days.

(21) Appl. No.: 10/424,266

(22) Filed: Apr. 28, 2003

(65) Prior Publication Data

US 2004/0212347 A1 Oct. 28, 2004

(51) Int. Cl.[7] ........................ H01M 10/44; H01M 10/46
(52) U.S. Cl. ........................................... 320/128
(58) Field of Search .............................. 320/127, 128, 320/140, 142, 165

(56) References Cited

U.S. PATENT DOCUMENTS

| | | | |
|---|---|---|---|
| 4,539,608 A | * | 9/1985 | Hill et al. ............... 360/77.05 |
| 5,012,247 A | * | 4/1991 | Dillman .................... 341/172 |
| 5,124,648 A | * | 6/1992 | Webb et al. ................ 324/253 |
| 5,384,526 A | | 1/1995 | Bennett |

* cited by examiner

*Primary Examiner*—Edward H. Tso
(74) *Attorney, Agent, or Firm*—Coats & Bennett, P.L.L.C.

(57) ABSTRACT

A battery charging circuit senses charging current using a sense circuit that includes a time-averaging amplifier circuit that nulls amplifier offset errors from the sensed current signal. With such offset correction, the sense circuit provides accurate current sensing over a wide dynamic range of charging current and thus may be used for low and high charging currents, and accurate detection of trickle and end-of-charge currents. The substantial elimination of amplifier-offset errors from charging current sensing permits use of a single sense resistor over a wide range of charging currents. Such accurate current detection supports zero-current regulation of the battery, which allows the battery to remain connected to the charging circuit even after reaching its end-of-charge condition. The battery charging circuit further may include digital switchover circuitry, which reduces charging control discontinuities by allowing both current and voltage feedback loops to drive the same regulation control circuit.

35 Claims, 7 Drawing Sheets

BATTERY CHARGING METHOD AND APPARATUS

BACKGROUND OF THE INVENTION

The present invention generally relates to rechargeable batteries, and particularly relates to battery charging methods and apparatus that offer improved charge current sensing accuracy.

Rechargeable batteries appear in a growing range of electronic devices. The use of rechargeable batteries is particularly common in portable electronics, such as cell phones, Portable Digital Assistants (PDAs), pocket and notebook computers, Global Positioning System (GPS) receivers, etc. No one rechargeable battery type finds universal usage across this diverse range of devices, as each battery type offers its own set of tradeoffs regarding performance, size and cost.

For example, types of rechargeable batteries include, but are not limited to, lead-acid cells, nickelcadmium cells, nickel/metal hydride cells, sodium/sulfur cells, nickel/sodium cells, lithium ion cells, lithium polymer, manganese-titanium (lithium) cells, nickel zinc cells, and iron nickel cells. Each of these battery chemistries offers its own mix of advantages and disadvantages regarding size, energy density (volumetric or gravimetric), cost, cell voltage, cell resistance, safety, toxicity, etc.

Despite such differences, some charging algorithms find broad applicability across a wide range of battery chemistries. As an example, the constant-current/constant-voltage (CC/CV) charging algorithm is adaptable to many different types of battery chemistries and, therefore, finds wide usage in a variety of battery charging products. With the CC/CV charging algorithm, a discharged battery is charged at a constant current until its cell voltage rises to a defined threshold voltage, e.g., the battery's "float voltage," at which point the charging control is switched to constant/voltage to charge the remaining capacity of the battery without exceeding the voltage limit of the battery. Thus, the CC/CV charging algorithm initially relies on current feedback charging control and then switches over to voltage-feedback control once the battery-under-charge reaches its float voltage.

As a matter of convenience, the charging current during the CC phase of recharge should be as high as possible within recommended limits because higher charging currents equate to lower recharge times. Battery manufacturers often rate battery capacity in terms of a given battery's "C rating," which is a scaling unit for the battery's charge and discharge currents. Charging or discharging the battery at rates beyond the "C" rating exceeds the safe rating of the battery. For example, a charge current of 1000 mAh (1 C) will charge a 1000 mAh battery in about an hour. Thus, charging current during the CC phase of recharging may be set according to the manufacturer's recommended C rate limit.

Proper C rate based charging requires relatively accurate current sensing to ensure that the CC phase of charging actually is regulated to the recommended C rating of the battery. In the above example, the 1 C charging current is 1 Amp and thus the current sensing used to regulate the charging current must sense current in the 1 A range with relatively good accuracy.

Most simple and economical current sensing techniques rely on Ohm's Law (V=IR), and thus measure current by sensing a current-induced voltage drop across a resistor or other series impedance element. For efficiency and low voltage dropout, such sense resistors typically are sized for a particular current range of interest. For example, a 100 mΩ sense resistor provides a very usable 100 mV sense voltage at 1 A of charging current. Obviously, as the charging current falls, so too does the sense voltage, and therein lies one of the many challenges faced by designers of battery charging systems. That is, the sense voltage decreases with decreasing charge current and circuit error sources, such as sense amplifier voltage offsets, become increasingly significant obstacles to accurate charge current measurement.

Further compounding these design challenges, not all charging environments offer the ability to charge at a battery's recommended C rate. For example, many battery-powered devices interface to Personal Computers (PCs) and the like via Universal Serial Bus (USB) connections. Portable music players, such as those based on the popular MP3 digital audio format, are just one example of such devices. Regardless, the USB standard defines low-power devices as those requiring less than 100 mA, and high power devices as those requiring up to 500 mA. Some USB ports support both low power and high power, and thus offer attached devices the ability to draw charging currents up to the high power limit of 500 mA. However, some USB ports support only low power devices and thus limit charging current to 100 mA. Ideally, a rechargeable USB device would operate with accurate charge current sensing regardless of the type of USB port to which it is attached.

Further charging scenario variations create additional challenges to reliable and accurate current sensing. For example, some types of battery technologies are incompatible with so-called "trickle" charges, i.e., continuous low current into the battery after it reaches its float voltage. Because of the inability of conventional charging systems to accurately sense very low levels of battery current, it is a common practice to include a transistor switch or other isolation device to "disconnect" the battery from the charging circuit after reaching an end-of-charge condition. The addition of the extra switching element adds undesirable expense and size to the charging circuit.

For these and other reasons, an ideal battery charging circuit would offer highly accurate current sensing over a wide range of charging currents. Accurate current sensing over a wide dynamic range would thus allow reliable and safe charging in various modes (e.g., low power and high power), would permit accurate end-of-charge current sensing, and would permit regulation down to an effectively "zero" charge current. That latter capability would eliminate the requirement for battery isolation switches as the charging circuit itself could regulate current into the battery essentially down to zero.

SUMMARY OF THE INVENTION

The present invention comprises a system and method to charge batteries based on accurately sensing battery charging currents over a wide dynamic range. In an exemplary embodiment, a battery charging circuit includes a sense circuit that includes a time-averaging amplifier circuit to accurately sense the charging current of a battery under charge. An exemplary time-averaging amplifier circuit comprises a polarity-switched amplifier that periodically switches amplifier signal polarities to null amplifier-offset errors from the sensed charging current.

For example, in at least one embodiment, the sense circuit generates the sense signal as a voltage that is proportional to the charging current, wherein the polarity-switched amplifier is used as a differential sensing amplifier that controls the sense signal. An adjustable element, such as a user-set resistor, may be used to provide a desired scaling between the sense signal and the battery charging current magnitude. In one polarity configuration, the polarity-switched amplifier's offset errors add to the sense signal and in the opposite polarity configuration those same offset errors subtract from the sense signal. Thus, by periodically switching between these polarity configurations, the amplifier's offset errors effectively are averaged out of the sense signal.

In at least one embodiment, the polarity-switched amplifier includes a differential amplifier having switched amplifier input and output connections. In an exemplary embodiment, one input switch selectively couples a current sensor, such as a series resistor disposed in the charging current path, to the non-inverting and inverting inputs of the amplifier, and another input switch selectively couples a sense feedback signal to the inverting and the non-inverting inputs of the amplifier. Similarly, an output switch selectively couples an output terminal of the amplifier to the positive and negative outputs of the differential amplifier. Each switch reverses its connections responsive to a polarity switching signal; thus, by driving the switches with a periodic clock signal, the amplifier's input and output connections are periodically reversed, which nulls, or at least substantially reduces, amplifier offset errors.

Substantially removing offset errors from the sense signal eliminates a principal error term associated with charge current sensing and permits the same sense circuit to be used over a wide range of battery charging circuits. Among the many advantages yielded by that capability is the opportunity to use a single sense resistor for detecting a wide range of charging currents. That is, with the effective elimination of amplifier offset errors, sense voltages in the range of the sense amplifier's input and output offset voltages can be detected. As such, the same sense circuit may be used to accurately detect high and low magnitude charging currents, as well as trickle charge currents and end-of-charge currents.

For example, in an exemplary embodiment, a battery charging circuit according to the present invention includes a charging control circuit coupled to the sense circuit. An exemplary charging control circuit comprises a current-feedback circuit responsive to the sense signal, a voltage-feedback circuit responsive to the charging voltage of the battery, and a pass control circuit that regulates charging current by controlling a pass circuit, e.g., a pass transistor, responsive to a first feedback signal from the current-feedback circuit or to a second feedback signal from the voltage-feedback circuit. Note that these first and second feedback signals may be voltage-mode or current-mode signals.

An exemplary pass control circuit includes a digital switchover circuit that provides mode control switching of the battery charging circuit. In a constant-current (CC) charging mode, the pass control circuit controls the pass circuit responsive to the feedback signal from the current-feedback circuit. In this mode, the battery charging circuit regulates the charging current to a desired magnitude, which may be adjusted by changing a constant-current reference signal, for example. With that approach, the reference signal may be set for the desired "C rate" charging magnitude until the battery voltage reaches its "float voltage" level or some other defined threshold. Subsequently, the reference signal may be adjusted to regulate to a much lower current, such as zero, or even a negative battery current.

In any case, during the CC charging mode, the digital switchover circuit monitors the feedback signal from the voltage-feedback circuit to detect when the charging voltage reaches a defined voltage level. At that point, a mode control circuit within the digital switchover circuit switches from driving the pass control circuit with the current feedback signal to driving it with the voltage feedback signal. In other words, the exemplary battery charging circuit switches from the CC charging mode to a constant-voltage (CV) charging mode, in which the pass control circuit maintains a fixed voltage on the battery by regulating the charging voltage on the battery responsive to the feedback signal from the voltage-feedback circuit.

Complementing the switchover operation, the digital switchover circuit also switches from monitoring from the voltage feedback signal to monitoring the current feedback signal. Thus, an exemplary digital switchover circuit monitors the current feedback signal while driving the pass control circuit with the voltage feedback signal, and monitors the voltage feedback signal while driving the pass control circuit with the current feedback signal. In other words, when the battery charging circuit is in the CC charging mode, it monitors the battery voltage to determine when to change to CV mode, and when the battery charging circuit is in CV mode, it monitors the battery charging current to determine whether it should change back to CC mode regulation.

By configuring the digital switchover circuit to have common input circuitry that is shared between the constant-current and constant-voltage feedback circuits, the same circuitry is used for both the charging mode comparison control function and the charging regulation control function. One advantage of using the same pass control circuit in the charging mode comparison function that determines the charging mode and in the linear control function that sets the charging output is that any circuit offsets are common to both the comparison and control functions. Such commonality ensures that no control discontinuities arise when the battery charging circuit switches from CC charging mode to CV charging mode or vice versa.

Hysteresis may be included in the mode comparator used in the switchover circuit to prevent "chatter" at the switchover point. By providing a hysteresis signal that forces the feedback to overdrive the reference signal by a fixed amount before entering a given mode of operation, chatter is eliminated. This hysteresis technique safely overdrives the output voltage of the charger when maximum current is being delivered into the battery.

As noted above, the sense circuit's wide dynamic range allows it to continue providing accurate charging current sensing even as the charging current begins falling off after the battery charging circuit transitions to the CV charging mode. Thus, in one embodiment, the charging control circuit continues monitoring the charging current via the sense circuit to detect an end-of-charge condition of the battery. Such monitoring may be incorporated into the digital switchover circuit or may be implemented elsewhere. For example, an exemplary charging control circuit includes a controller, such as a logic control circuit or state machine with appropriate signal interfaces to the current-feedback and voltage-feedback circuits.

With such embodiments, the controller detects the end-of-charge condition and adjusts a current-feedback reference signal to cause the charging control circuit to regulate the charging current for a zero, or even negative current level. Here, negative denotes a current from the battery, i.e., the battery sourcing current rather than sinking current. This zero-current regulation is in contrast to conventional chargers, which simply disconnect the battery after end-of-charge for safe isolation. Thus, the present invention's ability to accurately detect even very low charging currents permits reliable end-of-charge detection and obviates the need for isolation switching of the battery.

Those skilled in the art will appreciate other features and advantages of the present invention upon reading the following detailed description. However, it should be understood that the present invention is not limited by the following exemplary details, nor is it limited by the accompanying drawings.

DETAILED DESCRIPTION OF THE INVENTION

Figure 1:
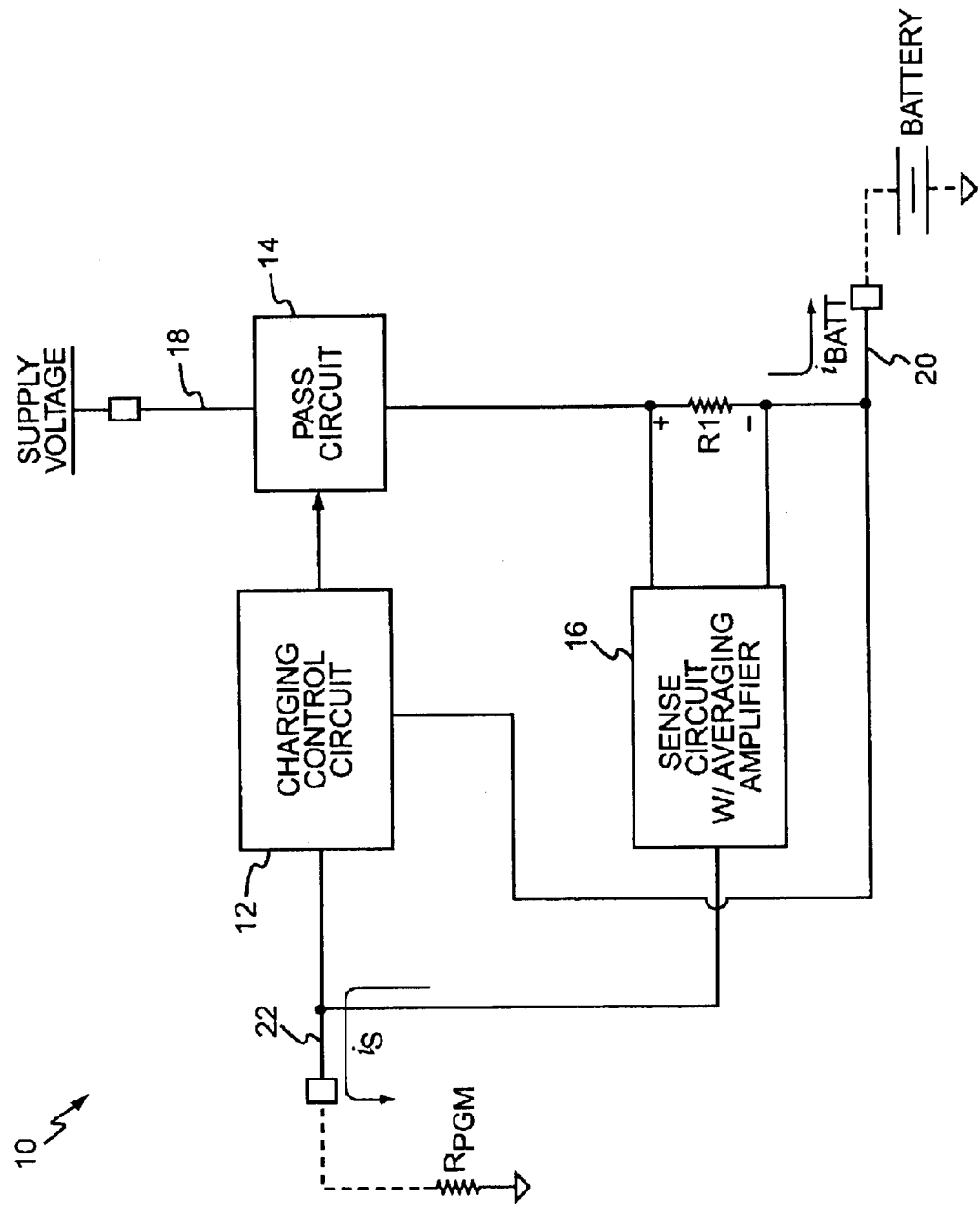
FIG. 1 is a diagram of a battery charging circuit according to an exemplary embodiment of the present invention.

FIG. 1 illustrates a battery charging circuit 10 according to an exemplary embodiment of the present invention. Charging circuit 10 comprises a charging control circuit 12, a pass circuit 14, and a sense circuit 16 that includes a time-averaging amplifier. The exemplary battery charging circuit 10 is coupled to a supply voltage via terminal 18, and is further coupled to a battery via a charging terminal 20 and to a program resistor, RPGM, via a program terminal 22.

In operation, battery charging circuit 10 uses pass circuit 14, which may comprise a pass transistor or the like to regulate the charging current and/or charging voltage associated with the battery. Here, pass circuit 14 functions as a voltage-controlled resistor place in series in the battery's charging current path but those skilled in the art will appreciate that other voltage-mode or current-mode control circuits, such as Pulse-Width-Modulation (PWM) based feedback control circuits, may be used as needed or desired to effect charging regulation.

Here, sense circuit 16 includes a current sensor to sense charging current associated with the battery. In this embodiment, the current sensor comprises a series resistor, R1, disposed in the charging current path of the battery. Thus, R1 develops a voltage drop that is proportional to the charging current and an exemplary sense circuit 16 generates a sense signal that is proportional to that voltage drop. Thus, an exemplary sense signal may comprise a voltage signal proportional to the charging current, and the ratio of that proportionality may be set or adjusted by changing the size of RPGM.

Note that RPGM may be fixed internally or externally, or may be adjustable, or at least user-selectable, to enhance the flexibility of battery charging circuit 10. Regardless of such details, as will be explained later herein, the time-averaging operation of sense circuit 16 nulls or otherwise substantially reduces amplifier offset errors associated with the operation of sense circuit 16, and thus greatly improves the ability of sense circuit 16 to accurately sense charging current over a wide range of sense voltages.

Figure 2:
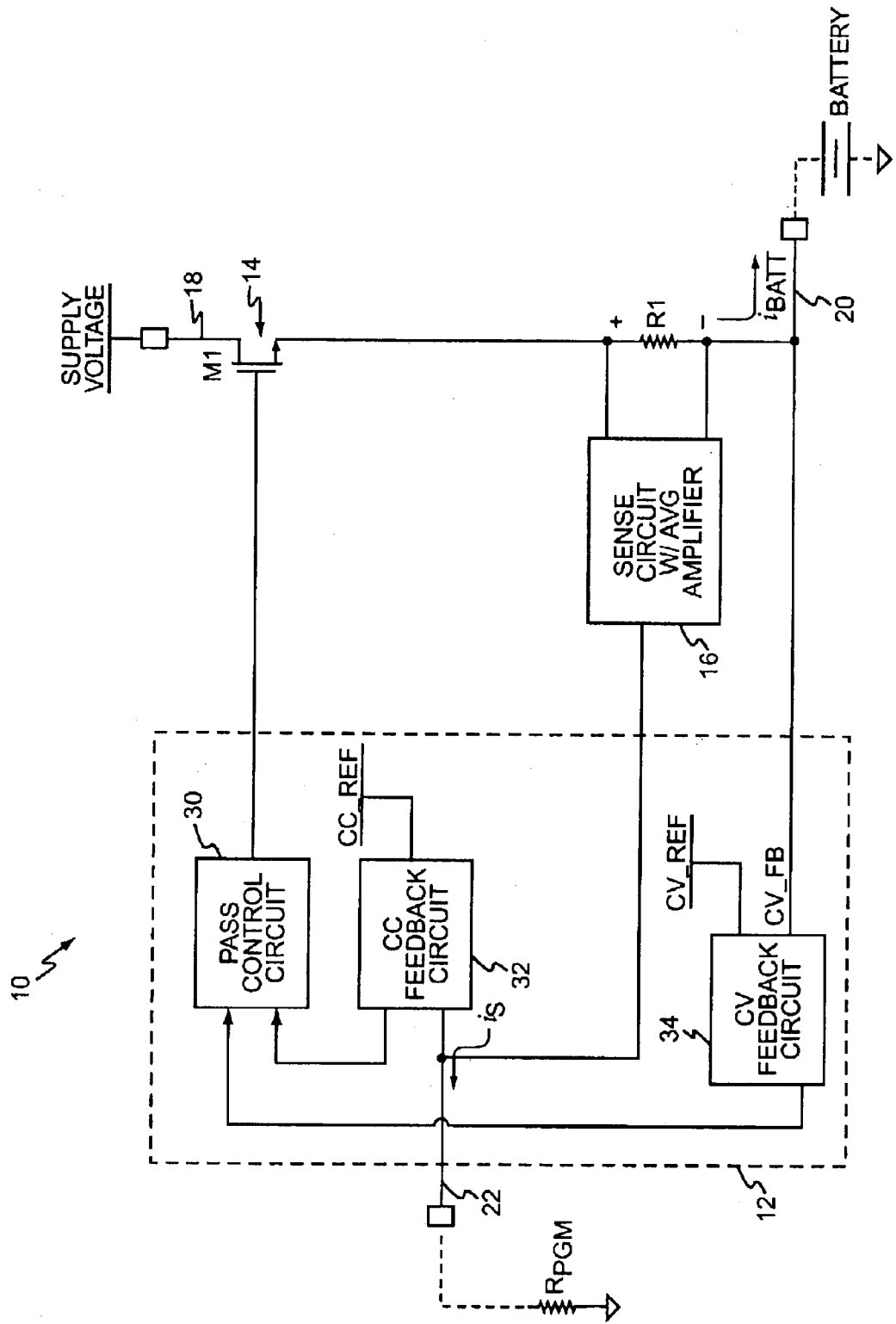
FIG. 2 is a diagram of exemplary charging control circuit details.

FIG. 2 illustrates an exemplary battery charging circuit 10 where the ability to sense charging current over a wide dynamic range is particularly advantageous. As was noted, pass circuit 14 might simply comprise a transistor, such as the one shown here as MOSFET M1. MOSFET M1 functions as a voltage-controlled resistor responsive to control circuit 12. An exemplary control circuit 12 comprises a pass control circuit 30, a constant-current (CC) feedback circuit 32 and a constant-voltage (CV) feedback circuit 34. With this configuration, the pass control circuit 30 controls pass circuit 14 such that it regulates charging current, regulates charging voltage, or both.

In an exemplary embodiment, the battery charging circuit 10 operates in a CC charging mode or in a CV charging mode. Thus, charging of a discharged battery may begin in the CC charging mode wherein the pass control circuit 30 controls pass circuit 14 to maintain a desired constant current into the battery responsive to a first feedback signal from the CC feedback circuit 32. That first feedback signal is generated by CC feedback circuit 32 as a function of the sense signal, which is generated by the sense circuit 16 based on battery charging current. In other words, pass control circuit 30 regulates or otherwise controls pass circuit 14 to maintain a desired charging current as indicated by the sense signal generated by sense circuit 16.

On that point, the sense circuit's ability to null sense amplifier offset errors from the sense signal greatly contributes to the ability to accurately regulate to desired constant currents over a wide range of current magnitudes. For example, the same sense resistor R1 may be used to regulate to a 100 milliamp charging current just as effectively as to a 1 amp charging current.

In the CC charging mode, the pass control circuit 30 generates a gate voltage for pass transistor M1 responsive to the first feedback signal from CC feedback circuit 32. However, pass control circuit 30 monitors a second feedback signal from constant voltage (CV) feedback circuit 34 to keep track of the battery's charging voltage. CV feedback circuit 34 may compare or otherwise reference the charging voltage to a constant voltage reference signal, which may be set based on a desired maximum voltage for the battery, such as a recommended or desired "float" voltage of the battery. Once the charging voltage reaches that reference level, the battery charging circuit 10 transitions from the CC charging mode to the CV charging mode. In the CV charging mode, pass control circuit 30 controls pass transistor M1 responsive to the second feedback signal from the CV feedback circuit 34 rather than the first feedback signal from the CC feedback circuit 32. Thus, pass control circuit 30 controls the gate voltage of transistor M1 to maintain a desired charging voltage on the battery. Note that that charging voltage is taken from the battery side of sense resistor R1 such that the charging current voltage drop through sense resistor R1 is not an error term with respect to sensing the battery charging voltage.

As part of transitioning to the CV charging mode, pass control circuit 30 switches from driving transistor M1 as a function of the current feedback signal to driving transistor M1 as a function of the voltage feedback signal. Additionally, pass control circuit 30 changes from monitoring the voltage feedback signal to monitoring the current feedback signal. That is, when the battery charging circuit 10 operates in the CC charging mode, pass control circuit 30 responds to the current feedback signal but monitors the voltage feedback signal. Conversely, when battery charging circuit 10 operates in the CV charging mode, pass control circuit 30 responds to the voltage feedback signal but monitors the current feedback signal.

Such monitoring of the current feedback signal during the CV charging mode is particularly useful in monitoring the charging current as the battery moves toward full charge. In particular, the accuracy of the sense signal gained by the time-averaging function of the sense circuit 16 enables the battery charging circuit 10 to accurately detect even very low charging currents through sense resistor R1.

Therefore, sense circuit 16 enables the battery charging circuit 10 to detect an end-of-charge condition of the battery, which is indicated by the charging current falling to a defined low-current threshold while the battery is being charged in the CV charging mode. Such end-of-charge detection may be useful in adjusting the current regulating threshold of the battery charging circuit 10 to a "zero" current level to prevent potentially dangerous excess charging of the battery.

Figure 3:
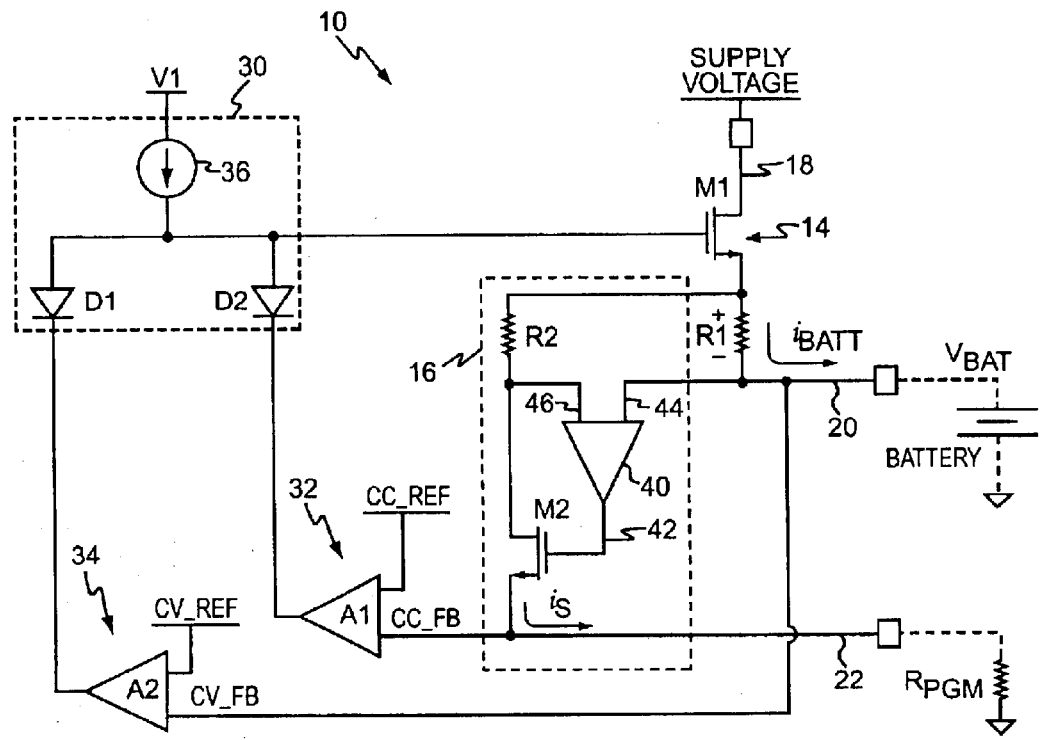
FIGS. 3 and 3A are diagrams of exemplary sense circuit details.

Since such functionality depends on accurate charging current detection and charging mode control, the discussion appropriately turns to exemplary details for charging control circuit 12 and sense circuit 16. FIG. 3 illustrates exemplary embodiments for these circuits.

As shown, the CC feedback circuit 32 may be implemented using amplifier A1, which is configured to compare a current regulation reference signal, CC_REF, with the sense signal generated by sense circuit 16. (Here, the sense signal is denoted as a constant-current feedback signal, CC_FB.) Similarly, the CV feedback circuit 34 may be implemented using amplifier A2, which is configured to compare a constant voltage reference signal, CV_REF, with the charging voltage of the battery denoted here as CV_FB.

Pass control circuit 30 is shown implemented in an exemplary analog embodiment wherein a constant current source 34 is sunk into amplifier A2 if diode D1 is forward biased, and is sunk into amplifier A1 if diode D2 is forward biased. Thus, the drive voltage applied to the gate of transistor M1 is a function of the output either from amplifier A1 or from amplifier A2, depending on the relative values of the current and voltage feedback signals as compared to the corresponding CC_REF and CV_REF signals.

For example, at the outset of the battery charging cycle, the charging voltage will be less than the reference voltage CV_REF and the output of amplifier A2 will be high. At the same time, the charging current will be relatively high and thus the sense signal CC_FB will exceed the charging current reference signal CC_REF and the output of amplifier A1 will be low relative to the output of amplifier A2. Thus, diode D1 is reverse biased while diode D2 is forward biased and the voltage on the gate of transistor M1 is determined by the relative values of CC_FB and CC_REF. Under that condition, the control loop closed through pass control circuit 30 establishes whatever gate voltage on transistor M1 that is required to achieve the desired charging current value as set by the CC_REF value. That is, pass control circuit 30 drives M1 to minimize the difference between CC_REF and CC_FB, thereby driving the charging current to the desired value.

Turning now to details of an exemplary sense circuit 16, a time-averaging amplifier circuit 40 that includes a switched-polarity output 42, and two switched-polarity inputs 44 and 46. Switched input 44 is coupled to the bottom of sense resistor R1, which also is connected to the charging output terminal 20. Switched input 46 is coupled to the bottom of a reference resistor R2, wherein the top of R2 is coupled to the top of sense resistor R1. Finally, switched output 42 is coupled to the gate of transistor M2, which is included in sense circuit 16. The drain of transistor M2 is coupled to the bottom of R2 and its source is coupled to the CC feedback circuit 32 and to RPGM.

In operation, amplifier 40 controls transistor M2, which may be a MOSFET or other type of device, such that the voltage drop across R2 follows the voltage drop across R1. That is, amplifier 40 controls transistor M2 such that the amount of sense current flowing through R2 results in R2 having the same voltage drop as R1. The current through R2 is returned to ground through RPGM (only minute current leaks into the high-impedance input of the CC feedback circuit 32.) Thus, the voltage resulting from the sense current is set by the value of RPGM, and by the ratio of R2 to R1. With this arrangement, the sense signal, CC_FB, is generated as a sense voltage proportional to the sense current, wherein the sense current is determined by the differential voltage between the switched inputs 44 and 46 of amplifier circuit 40.

Figure 4:
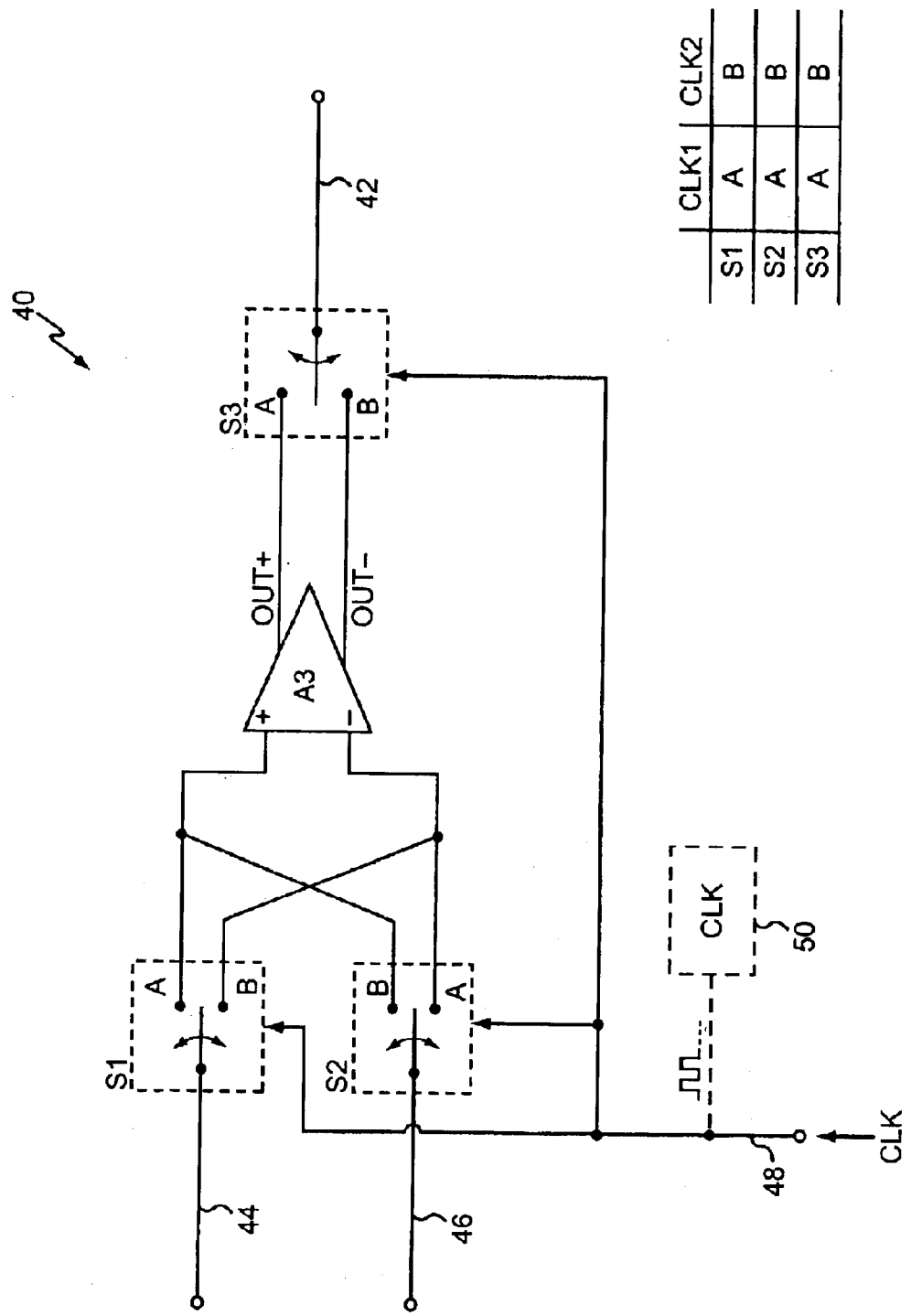
FIG. 4 is a diagram of exemplary time-averaging amplifier circuit details.

FIG. 4 illustrates exemplary details for the time-averaging amplifier circuit 40, in which a differential amplifier A3 is configured as a polarity-switched amplifier having its non-inverting and inverting inputs reversibly connected to the switched amplifier inputs 44 and 46 through switches S1 and S2. Similarly, polarity-switched amplifier A3 has its positive and negative outputs (VOUT+ and VOUT−) selectively coupled to output terminal 42 through switch S3. Note that "+" and "−" as used here connote relative signal levels and may not involve actual positive and negative voltages. For example, amplifier A3 could be biased to a given positive offset wherein VOUT+ was higher than the offset and VOUT− was lower than the offset.

Regardless, in operation, a clock signal applied to a clock input 48 provides a periodic switching signal that drives switches S1 through S3 such that the input and output connections of the polarity-switched amplifier A3 are periodically reversed. Note that time-averaging amplifier circuit 40 may include its own clock circuit 50 for local generation of the clocking signal.

As indicated in the illustration, the first clock signal, CLK1, sets switches S1 through S3 to the "A" connection and a subsequent clock signal, CLK2, reverses the switches to the "B" setting. In this manner, a succession of input clock pulses causes switches S1 through S3 to periodically reverse their connections and thereby reverse the amplifier input and output signal connections of the polarity-switched amplifier A3. As such, the duty cycle of the clock signal should be at or close to fifty percent to ensure that the amplifier offsets actually average out over time.

The effect of such polarity-switching operations is to null the amplifier offset errors that would otherwise manifest themselves in the sense signal output from sense circuit 16. That is, with a first switch setting, the offset errors of amplifier A3 add to the sense signal voltage and with the opposite or reverse switch setting those same offset errors subtract from the sense signal voltage. While the periodic polarity reversal may manifest itself as a slight ripple in the sense signal, any control ripple induced by pass transistor M1 will be filtered out by the capacitive load of the battery. Of course, program node 22 may be modified to include its own low pass filtering, such as an RC circuit, to provide internal filtering of any such polarity-switching ripple.

Figure 3A:
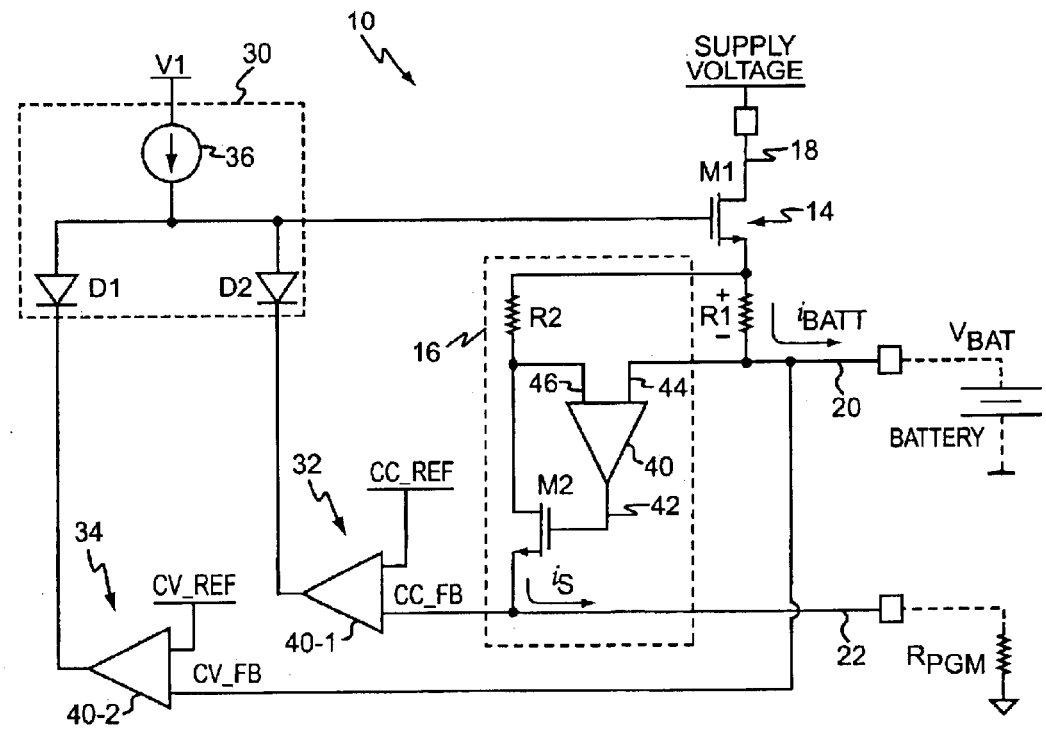

Use of the time-averaging amplifier circuit 40 within sense circuit 16 greatly reduces the effect of amplifier offset errors with regard to sensing the actual charging current into the battery. As noted, the reduction or elimination of such errors enables accurate current sensing even for very low charging currents. Of course, other amplifier offset errors may degrade operation of the battery charging circuit 10. Thus, additional time-averaging amplifiers 40 may be used elsewhere within battery charging circuit 10. For example, as shown in FIG. 3A, the CC mode feedback amplifier A1 of the CC feedback circuit 32 may be implemented as a time-averaging amplifier circuit 40-1 and/or the CV mode feedback amplifier A2 of the CV feedback circuit 34 may be implemented as a time-averaging amplifier circuit 40-2. Time-averaging as used on either or both of these feedback signals substantially removes amplifier offset errors from the CC and CV mode feedback signals.

Figure 5:
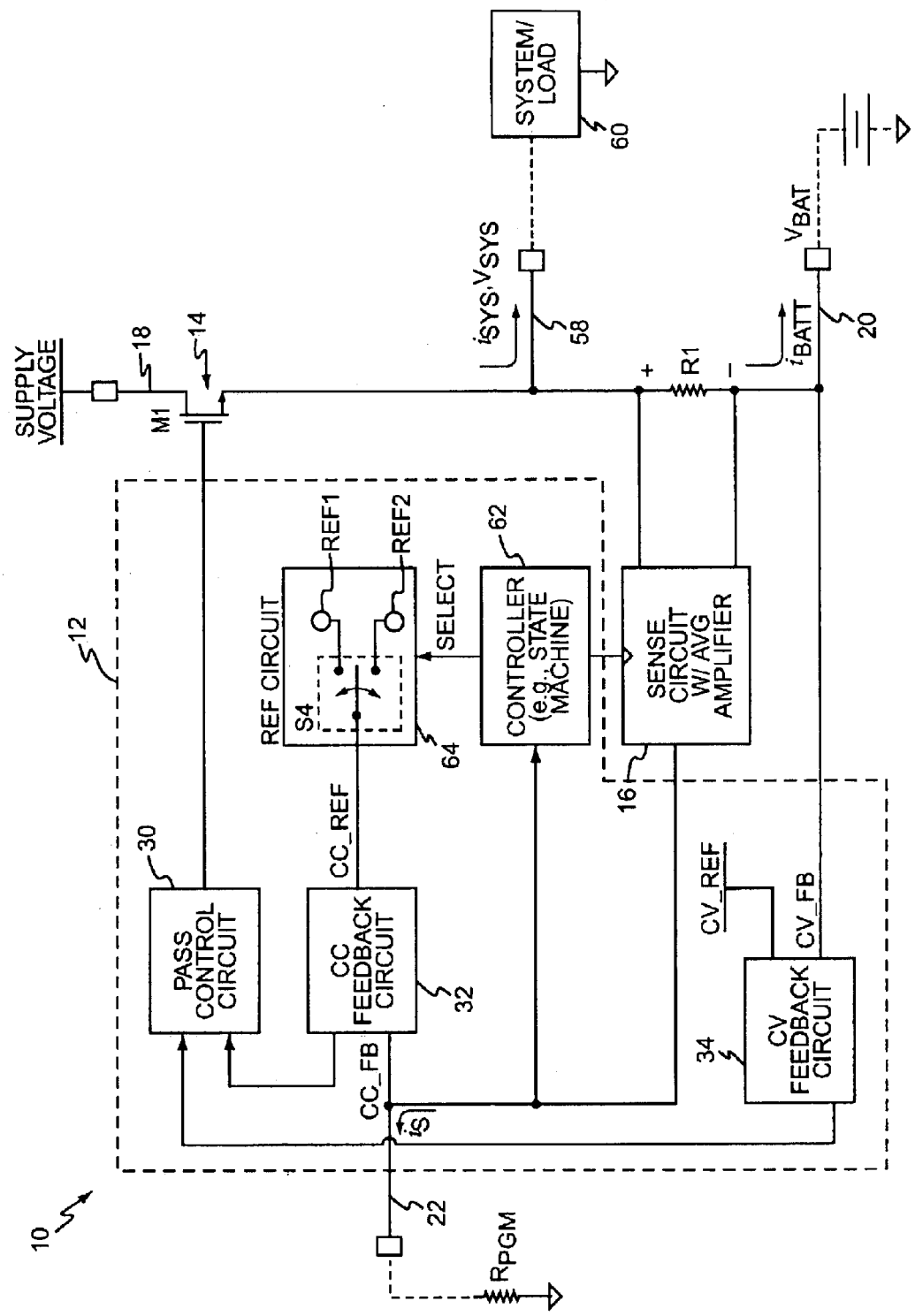
FIG. 5 is a diagram of a battery charging circuit that provides zero-current regulation according to another exemplary embodiment of the present invention.

FIG. 5 illustrates another exemplary embodiment of the battery charging circuit 10 that takes further advantage of the current sensing accuracy provided by the time-averaging amplifier circuit 40 of sense circuit 16. In this embodiment, battery charging circuit 10 provides a system terminal 58 in addition to the charging terminal 20. With this configuration, the battery is connected to the bottom of sense resistor R1 via terminal 20 while the battery's intended load 60 is connected to the top of sense resistor R1 via system terminal 58. Here, the intended load 60 comprises, for example, the electronic device normally powered by the battery.

With such an arrangement, the battery charging circuit 10 can source power from a supply voltage connected to the drain of pass transistor M1 directly to the system load 60 independent of the charging current provided to the battery. That is, the current sourced from system terminal 58 to power the load 60 does not interfere with sensing the charging current flowing into or out of charging terminal 20.

Thus, the battery charging current may be regulated irrespective of any current drawn by the load 60, which means that if the load 60 represents an electronic device such as a music player or cell phone, the device may be operated while the battery is charging without interfering with the ability of battery charging circuit 10 to sense and regulate charging current into the battery. As an additional advantage, the battery remains connected to the load 60 through sense resistor R1 such that it is ready to power the load 60 once the external supply voltage is disconnected from the charging adaptor input terminal 18 of pass circuit 14.

Complementing this arrangement, the charging control circuit 12 is shown with additional control and operating elements to support zero-current regulation mode of the battery, which obviates the need for including a battery isolation switch to protect the battery after reaching its end-of-charge condition. Specifically, the charging control circuit illustrated here includes a controller 62, which may be implemented as a state machine or other digital logic circuit having appropriate signal interfaces to the current feedback circuit 32 and voltage feedback circuit 34.

Charging control circuit 12 further includes a reference circuit 64, which may operate under control of controller 62 to support the previously mentioned zero-current regulation mode by providing different CC_REF signals (or, equivalently, providing a single but adjustable CC_REF signal). For the initial CC charging mode of operation, the controller 62 may switch the CC_REF signal to a first reference, REF 1, via switch S4 to establish a desired magnitude of current into the battery during its initial charging. However, after the battery charging circuit 10 transitions to CV charging mode, the controller 62 may continue to monitor the sense signal output from sense circuit 16 to detect when that current has fallen to a lower threshold indicative of the battery's end-of-charge condition.

Upon reaching that condition, it may be undesirable or even dangerous to continue allowing even slight amounts of positive charging current to flow into the battery. As such, controller 62 may switch reference circuit 64 from REF1 to a second reference, REF2, via switch S4. Changing the value of CC_REF causes a corresponding change in the current feedback signal from CC feedback circuit 32. Controller 62 may further indicate the end-of-charge condition to the pass control circuit 30 such that it switches its regulation to respond to the changed current feedback signal.

With the new reference signal setting for the CC feedback circuit 32, battery charging circuit 10 may now operate to regulate the charging current to a zero positive value, meaning that no current is allowed to flow into the battery. Indeed, the CC_REF signal may be adjusted such that battery charging circuit 10 regulates to a negative battery current, meaning that it controls pass transistor M1 such that a slight negative current flows out of the battery and into the system load even though the charging supply is still attached to the adaptor terminal 18.

In this manner, the battery charging circuit 10 guarantees that potentially harmful current is not allowed to flow into the battery after its end-of-charge condition, while simultaneously allowing the system load 60 to operate primarily from the attached external supply. Thus, the REF2 signal may be set to a level that causes battery charging circuit 10 to regulate the battery charging current to a very low or zero level. Indeed, as explained, REF2 may be set such that the battery charging circuit 10 ensures that slight negative current is drawn from the battery if the battery reaches its end of charge condition while the external charging supply is still attached to terminal 18. This capability allows the battery to remain connected to the battery charging circuit 10 (and to the load) even after reaching its end of charge condition, and therefore obviates the need for the bulk and added cost of battery isolation switches, which conventionally are used to isolate a fully charged battery from the charging supply.

With its ability to change modes between CC charging mode, CV charging mode, and end-of-charge regulation, an exemplary battery charging circuit 10 may include additional circuit features to eliminate or reduce potential control errors resulting from the different feedback mechanisms associated with such operating modes. That is, if the pass transistor M1 were controlled using separate control circuits in the CC and CV charging modes, there may be a slight control discontinuity associated with differing control circuit offsets, for example.

Figure 6:
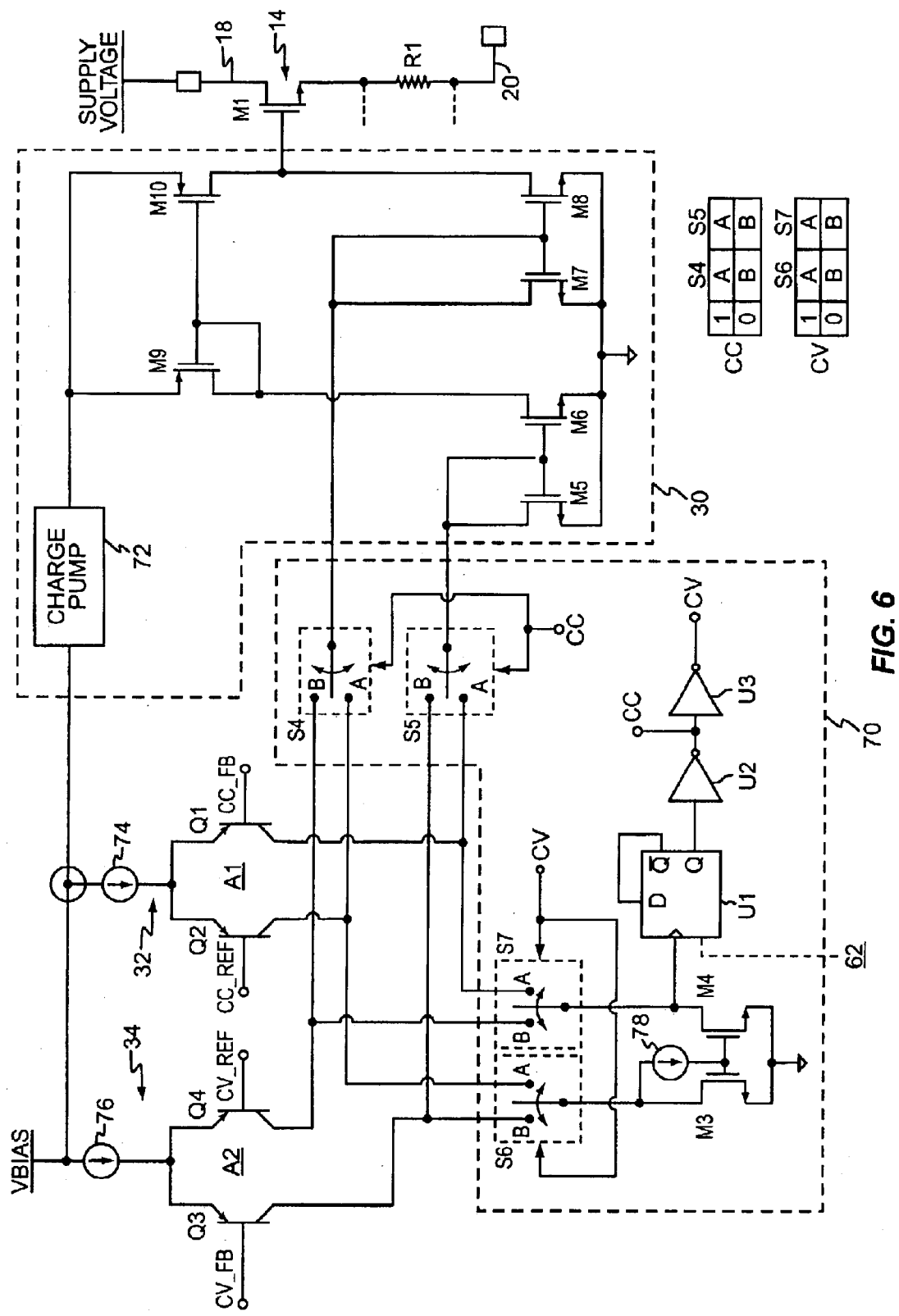
FIG. 6 is a diagram of exemplary digital switchover circuit details enabling exemplary charging mode control for one or more embodiments of the present invention.

As illustrated in FIG. 6, the exemplary battery charging circuit 10 avoids this by including a digital switchover circuit 70 that allows the pass control circuit 30 to be driven by the current feedback signal in the CC charging mode and by the voltage feedback signal in the CV charging mode. The digital switchover circuit 70 further may be responsive to a control signal from the controller 62 to accommodate zero-current regulation appropriate for the end-of-charge battery condition. As noted earlier herein, the digital switchover circuit 70 includes common input circuitry to support the mode control function and the charging regulation function.

In the illustrated embodiment, pass control circuit 30 is shown including a charge pump circuit 72 which is used to double or otherwise increase the available voltage for driving the gate of pass transistor M1, which is shown as an N-channel MOSFET device. It should be noted that if a P-channel device were used instead, charge pump circuit 72 could be eliminated. In any case, the CC feedback circuit 32 is shown as a differential transistor pair (Q1 and Q2) with an emitter-connected constant current source 72. A similar implementation is shown for CV feedback circuit 34, which is based on the Q3/Q4 differential transistor pair and constant current source 76. The differential pair signals are routed into switches S4 and S5 of digital switchover circuit 70.

These switches control which differential signal pair (CC feedback or CV feedback) is routed into the current steering MOSFETs M5 through M8 that cooperate with MOSFETs M9 and M10 to set the control voltage on the gate of pass transistor M1. Thus, when switches S4 and S5 are in the "A" setting, pass control circuit 30 is driven by the current feedback signal and when they are in the "B" setting the pass control circuit 30 is driven by the voltage feedback signal.

Controlling such operation, the digital switchover circuit 70 includes a mode control circuit comprising MOSFETs M3 and M4, D flip-flop U1, and inverting logic gates U2 and U3, along with switches S6 and S7. As was noted, the battery charging circuit 10 operates under constant-current feedback control while monitoring constant voltage feedback and operates under constant voltage feedback control while monitoring constant-current feedback. Thus, switches S6 and S7 are switched opposite of switches S4 and S5, meaning that while the current feedback signal (from the Q1/Q2 differential pair) is driving pass control circuit 30, the mode control circuit is monitoring the voltage feedback signal (from the Q3/Q4 differential pair) and vice versa. In an exemplary implementation, then, the output of the first logic inverter U2 is used to drive the S4/S5 switch pair and the output of the second series logic inverter U3 is used to drive the S6/S7 switch pair to effect opposite phase switching.

With the above arrangement, when the battery charging circuit 10 is in the CC charging mode the mode control circuit is driven by the second feedback signal and the pass control circuit 30 is driven by the first feedback signal. Conversely, when the battery charging circuit 10 is in the CV charging mode, the mode control circuit is driven by the first feedback signal and the pass control circuit 30 is driven by second feedback signal. Thus, use of the switches S4 . . . S7 provide common input circuitry for the constant-current and constant-voltage feedback circuits 32 and 34, respectively.

Optionally, the mode control circuit includes control hysteresis, which prevents "chatter" at the CC-CV control mode switchover point. In an exemplary implementation, control hysteresis is used to extend the constant-current charging mode slightly beyond the battery's targeted float voltage. That slight overcharge ensures stable switchover from the constant-current charging mode to the constant-voltage charging mode and reduces the overall charge time by slightly extending the constant-current charging mode time.

For example, assuming the targeted CC-to-CV switchover point is 4.2 VDC (on the battery), mode control hysteresis may be used to force the battery charging circuit 10 to remain in CC mode until the battery is driven to 4.21 VDC before switching over to the CV charging mode. The 0.01 VDC "overdrive" does not harm the battery, but it does allow the battery charging circuit 10 to remain in CC charging mode longer than it otherwise would, which shortens the CV portion of the overall charge cycle and results in a shorter overall charging time.

An exemplary implementation of charging mode hysteresis may be based on the use of current source 78 to provide a hysteresis signal that introduces an offset voltage on the gate of the diode-connected transistor, M3. When the battery charging circuit 10 is in CC charging mode, current source 78 tracks the tail currents of the Q3/Q3 differential pair input stage that comprise amplifier A2 of the CV feedback circuit 34. Thus, current source 78 may be implemented as a common-source current mirror of Q3/Q4 when in CC charging mode to ensure that its current is a desired fraction of the Q3/Q4 tail currents. In CC charging mode where the CV feedback signal is being monitored, the current through transistor Q3 is reduced in proportion to the hysteresis current introduced by current source 78. Thus, the battery voltage signal must exceed the corresponding reference signal (CV_REF) by a proportionate amount before switchover circuit 70 changes from CC charging mode to CV charging mode.

The overall effect of digital switchover circuit 70 is to allow both feedback circuits 32 and 34 to drive the same gate control circuit for pass transistor M1, i.e., feedback circuits 32 and 34 each drive the same pass control circuit 30. With this arrangement, whatever circuit offsets or errors that exist in amplifiers A1 or A2 of the constant-current and voltage feedback circuits 32 and 34, respectively, are shared by the mode comparison and charging control functions to eliminate control discontinuities.

Given the many features and implementation details discussed above, those skilled in the art will recognize that the various embodiments of the battery charging circuit 10 may be implemented in a number of ways. For example, battery charging circuit 10 may be implemented using discrete circuit components such as discrete operational amplifiers, programmable logic devices, transistors, logic gates, resistors, etc.

However, given its superior performance and its ability to eliminate the need for battery isolation switches, it is contemplated that the battery charging circuit 10 will find broad application in a variety of portable battery powered devices where space is at a premium. As such, an exemplary battery charging circuit 10 is implemented as an integrated circuit device that may incorporate the pass control transistor M1, the sense resistor R1, and select ones of the other illustrated circuit elements. Indeed, battery charging circuit 10 may be configured such that essentially the only external element required is the program resistor RPGM. While RPGM also could be internal to the battery charging circuit 10, implementing it as an external element provides the end user with the flexibility of conveniently setting the desired level of charging current for the CC charging mode of operation.

Figure 7:
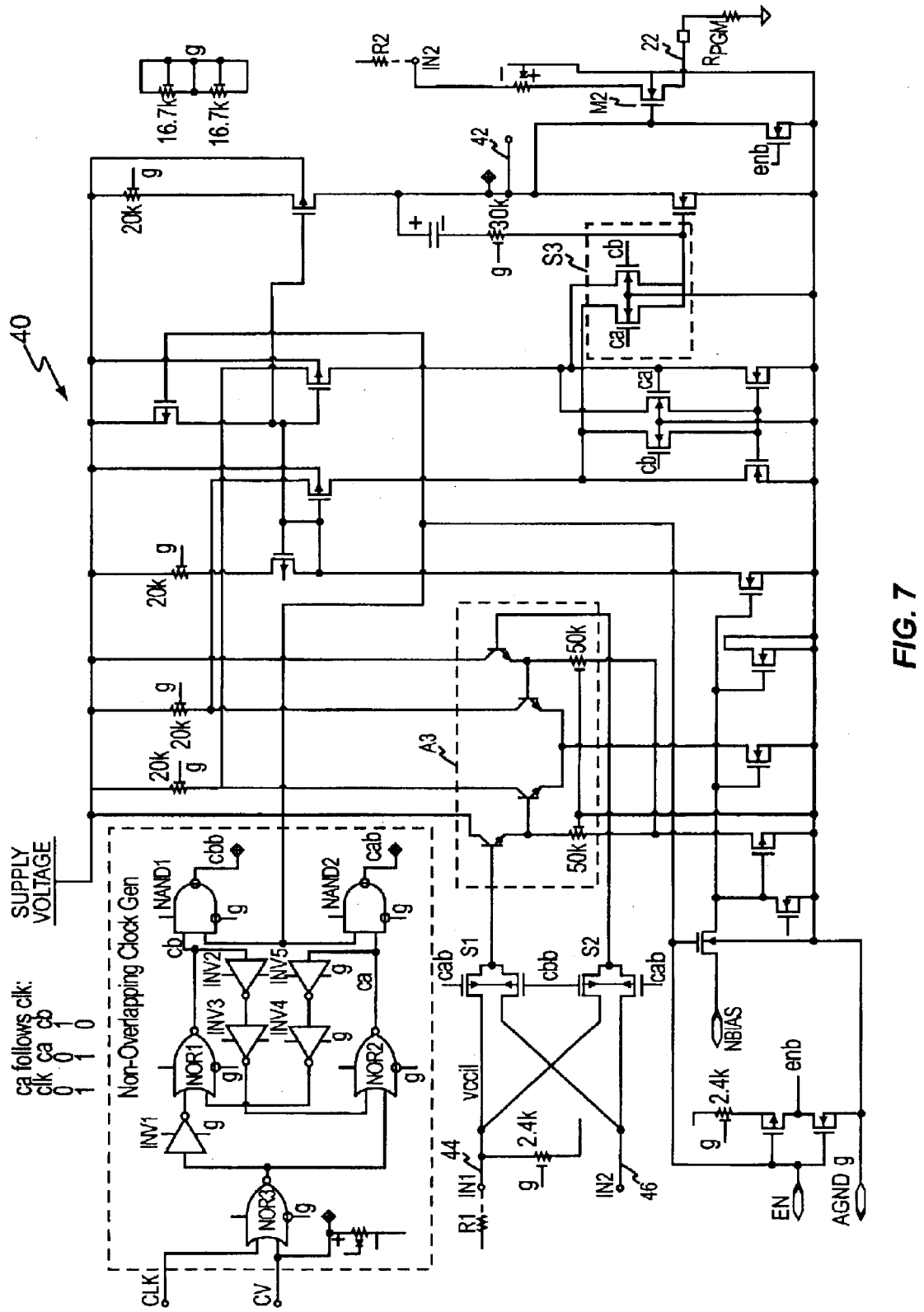
FIG. 7 is a diagram of exemplary integrated circuit details for the time-averaging amplifier circuit of FIG. 4.

FIG. 7 illustrates an exemplary integrated circuit embodiment for the time-averaging amplifier circuit 40 of sense circuit 16. It should be understood that the charging control circuit 12 would be integrated into the same integrated circuit (IC) as the sense circuit 16 in an exemplary embodiment. While it is not necessary to discuss every active and passive device illustrated in the schematic, it may be helpful to note the correspondence between particular schematic elements and the prior illustrations.

For example, one sees the switched input connections 44 and 46 of the polarity-switched amplifier A3 illustrated at the middle left of the schematic. For clarity, sense resistor R1 and reference resistor R2 are shown with their respective switched input connections, IN1 and IN2. As illustrated, switches S1 and S2 may be implemented using MOS transistors or other solid-state devices to provide the desired polarity-reversing input switching of amplifier A3. One also notes the switched output connection of amplifier A3 as provided by polarity-reversing switch S3 that, again, may be implemented using integrated MOS transistors or other solid-state switching devices.

Further, one sees that the signal output from switch S3 drives the gate of transistor M2, which sinks current through reference resistor R2 and out through the program terminal 22 into the external resistor RPGM. Thus, as noted before, the polarity-switching provided for amplifier A3 allows the sense signal developed on RPGM to be substantially free from any amplifier offset errors.

It is worth noting that while the above discussion provides exemplary and enabling details for implementing one or more embodiments of the inventive battery charging circuit 10, the present invention is not limited by such details, nor is it limited by the accompanying drawings. Indeed, the present invention is limited only by the following claims and their reasonable equivalence.

What is claimed is:

1. A battery charging circuit comprising a sense circuit that includes a time-averaging amplifier circuit to accurately sense a charging current of a battery under charge, said time-averaging amplifier circuit comprising a polarity-switched amplifier that periodically switches amplifier signal polarities to null amplifier offset errors from the sensed charging current.

2. The battery charging circuit of claim 1, wherein the battery charging circuit further comprises a charging control circuit coupled to the sense circuit, and wherein the charging control circuit includes a pass control circuit to control the charging current of the battery.

3. The battery charging circuit of claim 2, wherein the charging control circuit further comprises a digital switchover circuit to drive the pass control circuit with a first feedback signal in a constant-current (CC) charging mode and to drive the pass control circuit with a second feedback signal in constant-voltage (CV) charging mode, said first feedback signal derived from the sense signal and said second feedback signal derived from a charging voltage of the battery.

4. The battery charging circuit of claim 3, wherein the digital switchover circuit includes one or more pass control switches to selectively couple the first feedback signal to the pass control circuit in the CC charging mode, and to selectively couple the second feedback signal to the pass control circuit in the CV charging mode.

5. The battery charging circuit of claim 3, wherein the digital switchover circuit includes a mode control circuit to select between the CC and CV charging modes.

6. The battery charging circuit of claim 5, wherein the mode control circuit includes one or more mode control switches to selectively couple the second feedback signal to the mode control circuit in the CC charging mode, and to selectively couple the first feedback signal to the mode control circuit in the CV charging mode, such that the mode control circuit monitors the second feedback signal while the pass control circuit is driven by the first feedback signal, and monitors the first feedback signal while the pass control circuit is driven by the second feedback signal.

7. The battery charging circuit of claim 5, wherein the mode control circuit includes a hysteresis circuit to introduce a desired amount of signal hysteresis at least to a mode switchover from the CC charging mode to the CV charging mode.

8. The battery charging circuit of claim 3, further comprising:
a constant-current feedback circuit to generate the first feedback signal responsive to the sense signal; and
a constant-voltage feedback circuit to generate the second feedback signal responsive to the charging voltage.

9. The battery charging circuit of claim 8, wherein the constant-current feedback circuit includes a first output amplifier to provide the first feedback signal and the constant-voltage feedback circuit includes a second output amplifier to provide the second feedback signal, and wherein the digital switchover circuit couples the first output amplifier to the pass control circuit in the CC charging mode and couples the second output amplifier to the pass control circuit in the CV charging mode.

10. The battery charging circuit of claim 8, wherein the constant-current feedback circuit includes a second time-averaging amplifier circuit to generate the first feedback signal and to null amplifier offset errors from the first feedback signal.

11. The battery charging circuit of claim 8, wherein the constant-voltage feedback circuit includes a second time-averaging amplifier circuit to generate the second feedback signal and to null amplifier offset errors from the second feedback signal.

12. The battery charging circuit of claim 8, further comprising a logic circuit that adjusts a reference signal of the constant-current feedback circuit responsive to detecting an end-of-charge condition of the battery such that the battery charging circuit controls the pass control circuit to prevent further charging current from flowing into the battery.

13. The battery charging circuit of claim 12, wherein the battery charging circuit includes a first terminal to source supply current into an external load, and further includes a second terminal to source or sink the charging current, and wherein the first and second terminals are connected through a charging current sense resistor included within the battery charging circuit.

14. The battery charging circuit of claim 1, wherein the polarity-switched amplifier switches amplifier input and output signal polarities responsive to a periodic polarity switching signal.

15. The battery charging circuit of claim 14, further comprising a clock circuit to generate the periodic polarity switching signal as a periodic clock signal.

16. A battery charging circuit comprising:
a sense circuit to generate a sense signal responsive to sensing a charging current associated with a battery under charge; and
a charging control circuit to control charging of the battery responsive to the sense signal;
said sense circuit including a time-averaging amplifier circuit to generate the sense signal and to substantially null amplifier offset errors from the sense signal.

17. The battery charging circuit of claim 16, wherein the charging control circuit comprises a pass control circuit to control the charging current responsive to a first feedback signal, and further comprises a constant-current (CC) feedback circuit to generate the first feedback signal responsive to the sense signal such that battery charging circuit operates in a constant-current (CC) charging mode.

18. The battery charging circuit of claim 17, wherein the charging control circuit further comprises a constant-voltage (CV) feedback circuit to generate a second feedback signal responsive to the battery voltage, and wherein the battery charging circuit transitions from the CC charging mode to a constant-voltage (CV) charging mode after the battery voltage reaches a defined voltage level.

19. The battery charging circuit of claim 18, wherein the pass control circuit includes a drive circuit to control a pass device disposed in a charging current path of the battery, and further includes a digital switchover circuit to selectively couple the CC feedback circuit or the CV feedback circuit to the drive circuit, such that the same drive circuit is common to both feedback circuits.

20. The battery charging circuit of claim 19, wherein the digital switchover circuit includes common input circuitry for charging mode comparison and charging regulation control functions.

21. The battery charging circuit of claim 19, wherein the CC feedback circuit includes a first transistor differential pair to generate the first feedback signal as a first differential signal based on a CC reference signal and the sense signal, and wherein the CV feedback circuit includes second transistor differential pair to generate the second feedback signal as a second differential signal based on a CV reference signal and the battery voltage.

22. The battery charging circuit of claim 21, wherein the digital switchover circuit couples the first differential transistor pair to the drive circuit in the CC charging mode and couples the second differential transistor pair to the drive circuit in the CV charging mode.

23. The battery charging circuit of claim 16, wherein the time-averaging amplifier circuit substantially nulls amplifier offset errors from the sense signal by reversing amplifier input and output connection polarities responsive to a polarity switching signal.

24. The battery charging circuit of claim 16, wherein the time-averaging amplifier circuit substantially nulls amplifier offset errors from the sense signal by averaging out input and output voltage offsets of a differential amplifier used to generate the sense signal responsive to sensing a differential voltage signal induced by the charging current.

25. The battery charging circuit of claim 16, wherein the time-averaging amplifier circuit comprises:
   an amplifier to generate a first signal proportional to a differential voltage induced by the charging current; and
   polarity-reversing input and output switches to selectively reverse input and output signal connections of the amplifier;
   said polarity-reversing input and output switches responsive to a periodic polarity switching signal to alternate between reversed and non-reversed signal connections.

26. The battery charging circuit of claim 25, wherein the time-averaging amplifier circuit further comprises a pass transistor that sources current into a program resistor responsive to the first signal to thereby generate the sense signal in proportion to the charging current.

27. The battery charging circuit of claim 25, further comprising a switching clock to generate the polarity switching signal.

28. A method of accurately sensing a charging current into a battery comprising:
   using an amplifier to generate a sense signal proportional to the charging current;
   periodically reversing signal polarities of the amplifier to null amplifier offset errors from the sense signal and thereby improve sense signal accuracy.

29. The method of claim 28, wherein periodically reversing signal polarities of the amplifier to null amplifier offset errors from the sense signal comprises periodically reversing inverting and non-inverting input signal connections of the amplifier.

30. The method of claim 28, wherein periodically reversing signal polarities of the amplifier to null amplifier offset errors from the sense signal further comprises periodically reversing inverting and non-inverting output signal connections of the amplifier in concert with said periodically reversing inverting and non-inverting input signal connections of the amplifier.

31. The method of claim 28, further comprising controlling the charging current responsive to the sense signal and detecting an end-of charge condition of the battery based on the sense signal falling below a defined threshold.

32. The method of claim 31, further comprising leaving the battery electrically connected to a charging circuit after detecting the end-of-charge condition but controlling the charging current such that no charging current enters the battery.

33. A method of accurately sensing a charging current into a battery comprising:
   generating a sense signal proportional to the charging current using a time-averaging amplifier circuit that nulls offset errors in the sense signal;
   controlling a charging circuit based on the sense signal to maintain the charging current at a desired magnitude if a charging voltage of the battery remains below a defined voltage threshold; and
   controlling the charging circuit based on the charging voltage to maintain a constant charging voltage on the battery if the charging voltage equals the defined voltage threshold.

34. The method of claim 33, further comprising monitoring the sense circuit to detect a lower threshold of charging current while controlling the charging circuit based on the charging voltage to thereby detect an end-of-charge condition of the battery.

35. The method of claim 34, further comprising configuring the charging circuit such that it regulates the charging current at or below a zero positive current into the battery in response to detecting the end-of-charge condition.

* * * * *